United States Patent [19]

Ishida et al.

[11] Patent Number: 4,942,453
[45] Date of Patent: Jul. 17, 1990

[54] IC PACKAGE

[75] Inventors: Yoshihiro Ishida; Yoshio Iinuma; Shingo Ichikawa, all of Saitama, Japan

[73] Assignee: Citizen Watch Co., Ltd., Tokyo, Japan

[21] Appl. No.: 244,794

[22] Filed: Sep. 15, 1988

[30] Foreign Application Priority Data

Apr. 26, 1988 [JP] Japan ................. 63-102998
May 17, 1988 [JP] Japan ................. 63-118169
Jun. 3, 1988 [JP] Japan ................. 63-136856

[51] Int. Cl.$^5$ ............... H01L 23/48; H01L 29/44; H01L 29/52; H01L 29/60
[52] U.S. Cl. ............... 357/68; 357/71; 357/80; 361/412; 361/413; 361/393
[58] Field of Search .............. 357/68, 71, 72, 75, 357/45; 361/412, 413, 392, 393, 394, 395

[56] References Cited

U.S. PATENT DOCUMENTS 3,260,982 7/1966 Bostwick ................. 361/413
3,300,686 1/1967 Johnson et al. ............ 361/413
4,439,809 3/1984 Weight et al. ............. 361/413
4,626,961 12/1986 Ono et al. ................. 361/412
4,704,599 11/1987 Kimmel et al. ............. 361/413
4,780,792 10/1988 Harris et al. .............. 361/412

FOREIGN PATENT DOCUMENTS 0181161 11/1982 Japan ..................... 357/68
0030176 2/1983 Japan ..................... 357/80

Primary Examiner—Rolf Hille
Assistant Examiner—Hoanganh Le
Attorney, Agent, or Firm—Koda & Androlia

[57] ABSTRACT

A device for packaging many memory IC chips having a plurality of common connecting terminals on a main circuit board. A plurality of IC chips are packaged on an auxiliary board to make an IC chip unit, and a plurality of IC chip units are aligned on the main circuit board. The connections between unit-connecting terminals provided on the respective IC chip units and the main circuit board are made by means of wiring patterns on the main circuit board.

13 Claims, 17 Drawing Sheets

FIG.4 (A)
FIG.4 (B)
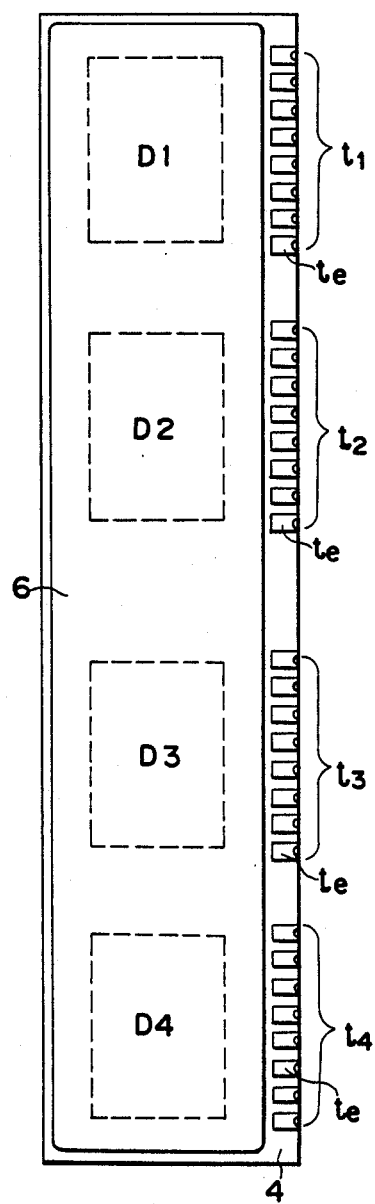
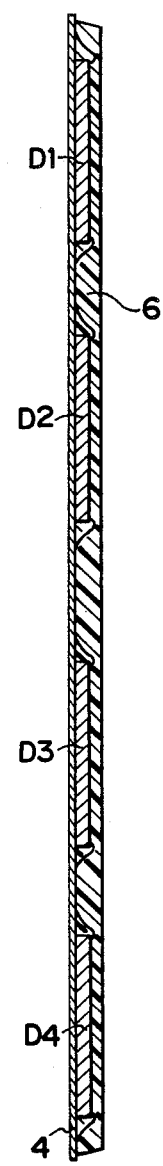

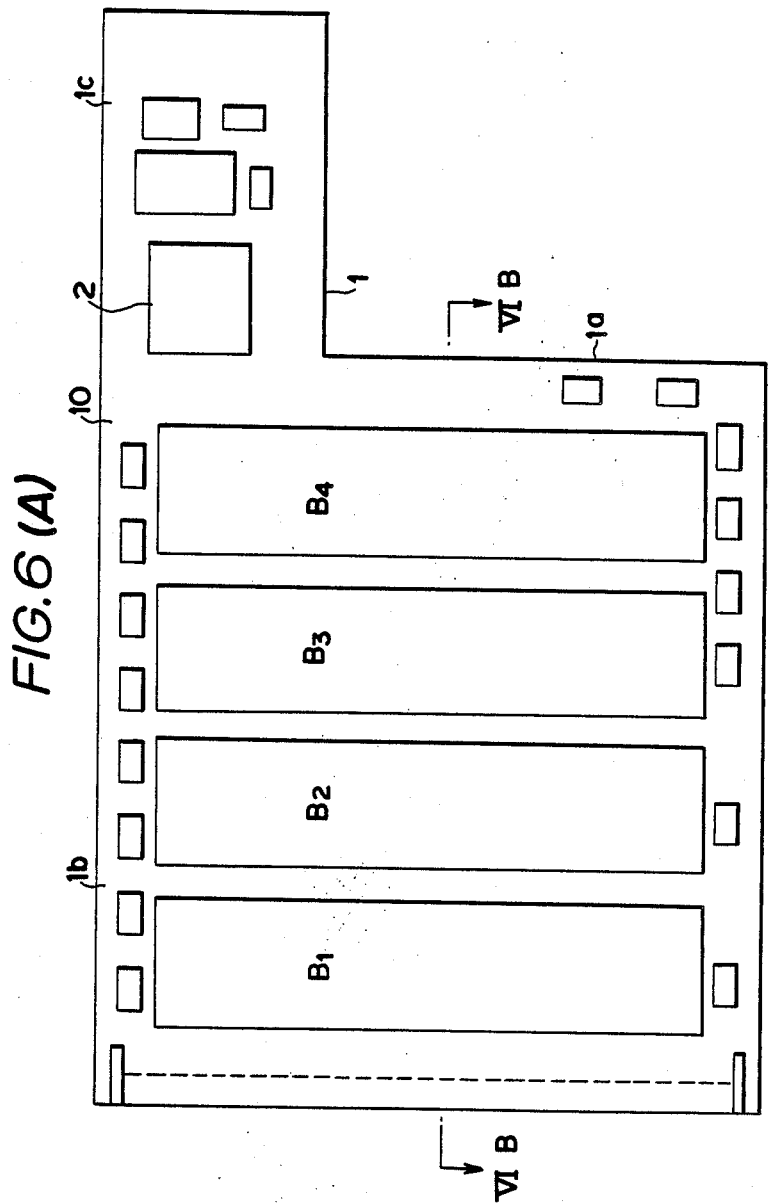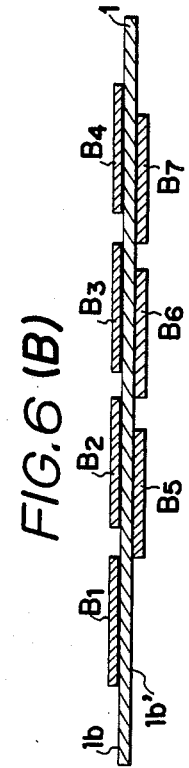

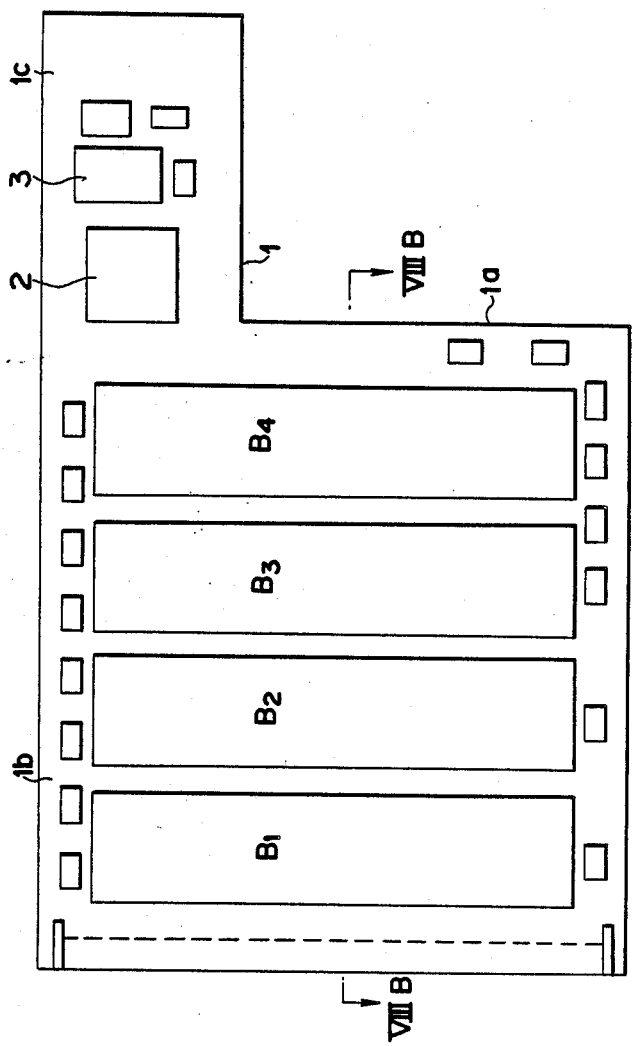
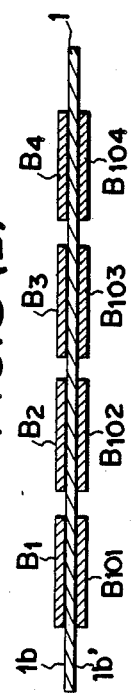
FIG.8 (A)
FIG.8 (B)

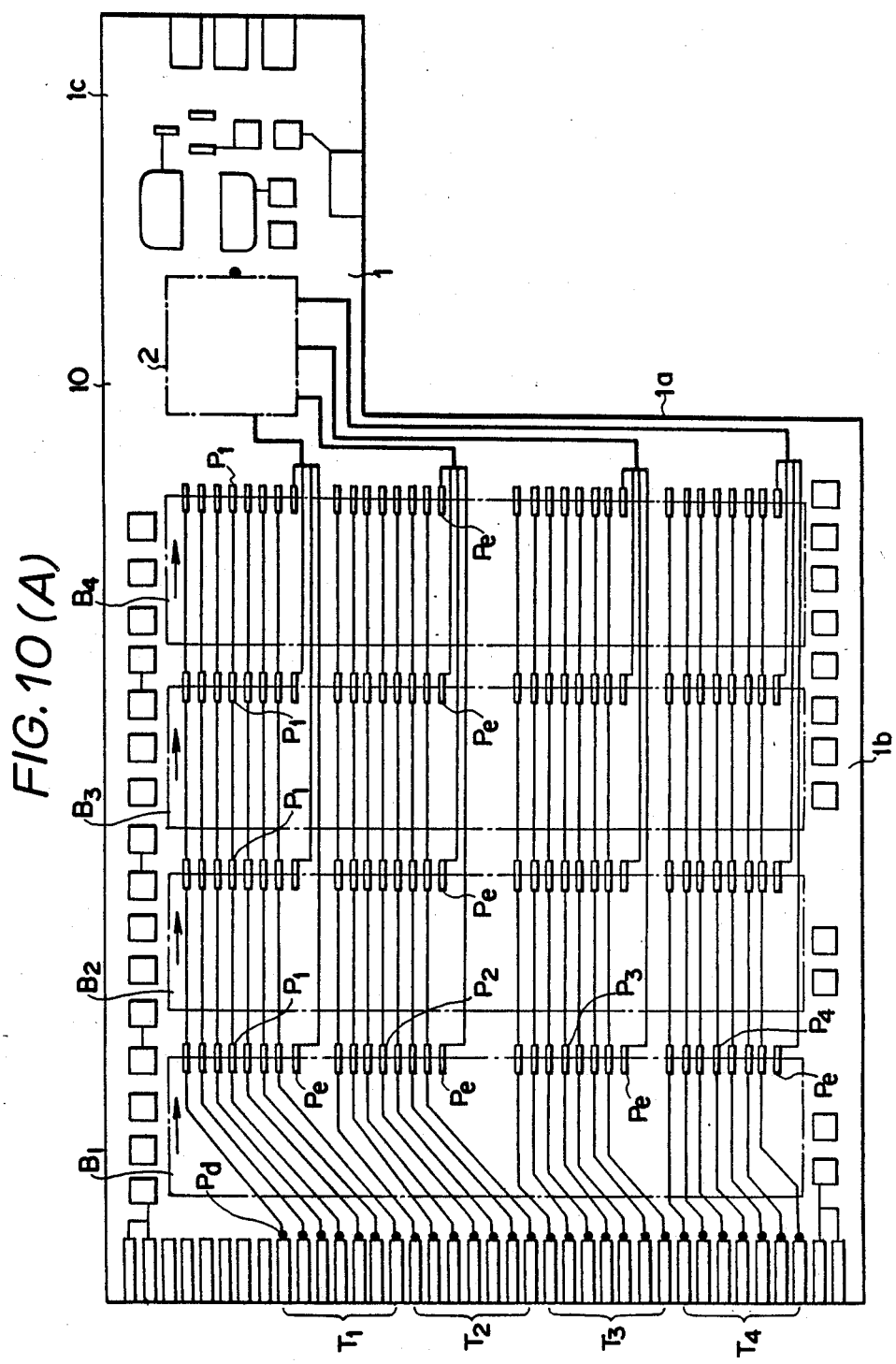

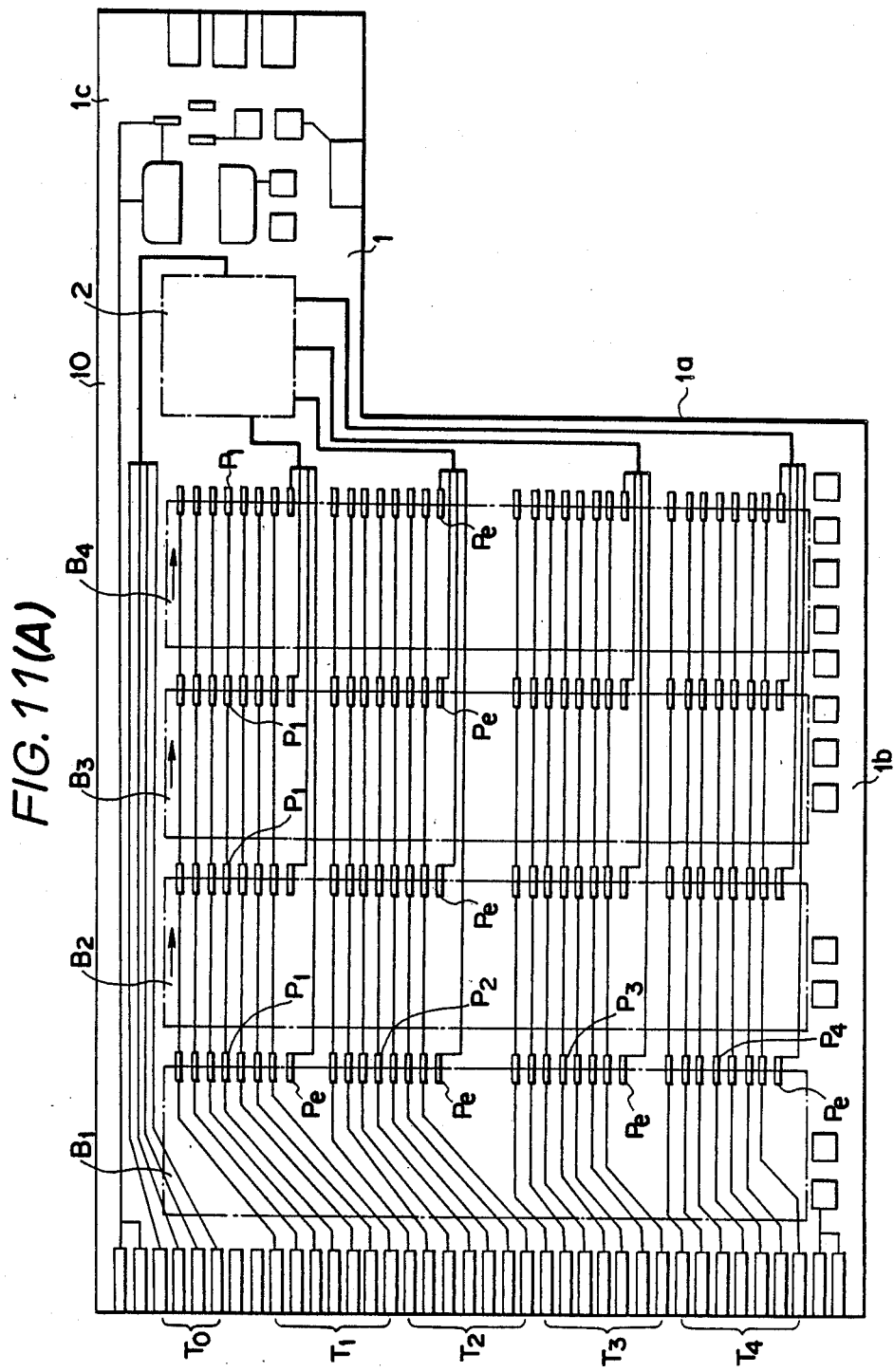

FIG. 12(A)
FIG. 12(B)
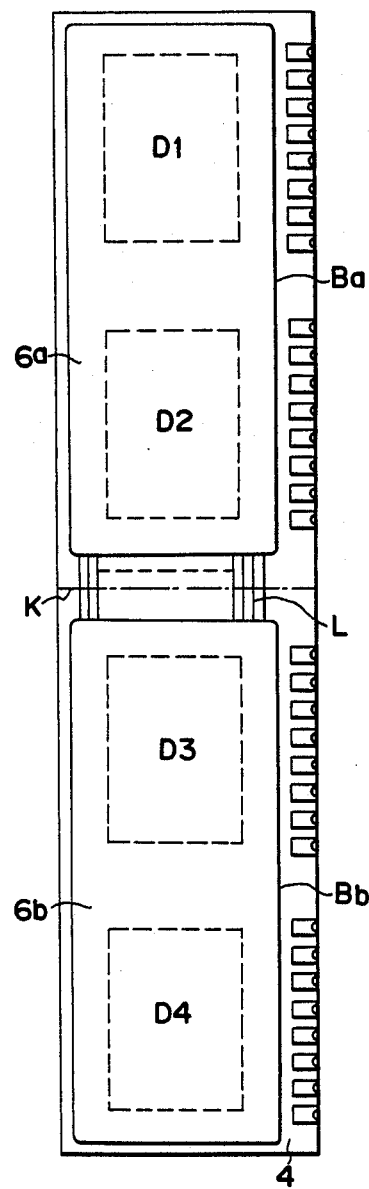
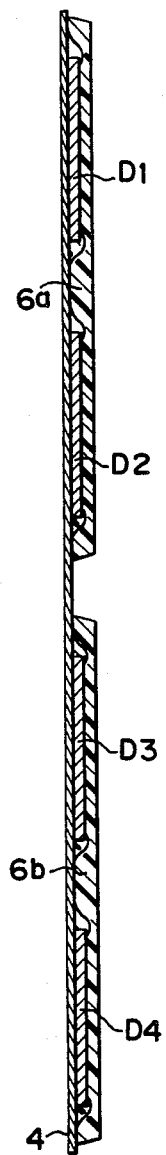

IC PACKAGE

BACKGROUND OF THE INVENTION

1. Field of the Invention

This invention relates to an IC package having a plurality of multiterminal IC chips, such as a memory card.

2. Description of the Related Art

In recent years, as the capacities of semiconductor memories, e.g. ROM's and RAM's, have been increased, memory cards in which many IC chips for these semiconductor memories are packaged upon or within a single substrate, have been manufactured and used in a wide area of application such as games and process controls.

However, the above IC chips for semiconductor memories have each thirty to fifty connecting terminals, and these connecting terminals are common connecting terminals such as data bus terminals and control bus terminals, with the exception of some individual terminals such as a chip enable terminal. Thus there is a problem of connecting and wiring of these common connecting terminals and individual connecting terminals on a small substrate.

A conventional wiring structure will now be described with reference to the drawings:

FIG. 1 is a plan view of a conventional memory card; FIG. 2(A) is a partially plan view illustrating connecting and wiring between IC chips of the conventional memory card; and FIG. 2(B) is a partially sectional view thereof. A substrate 50 which forms a memory card 5 is a double-sided wiring board, as shown in FIG. 2(B). On an upper surface 50a, twenty IC chips denoted at $A_1$ to $A_{20}$ are bonded, and upper surface patterns "a" each shown by a solid line, bonding patterns "n" each shown by a solid circle and through-hole patterns "m" each shown by an open circle are provided. On the other hand, on a lower surface 50b, lower surface patterns "b" each shown by a dashed line are provided and connected to upper surface 50a by means of through-hole patterns "m".

As shown in FIG. 2(A), each IC chip "A" is square-shaped and one pair of opposite edges "c" and "d" are each provided with twenty connecting terminals, while the other pair of opposite edges "e" and "f" are not provided with any connecting terminal. And all the connecting terminals provided along edge "c" are common connecting terminals, and among the connecting terminals provided along edge "d", nineteen terminals are common connecting terminals and one terminal is a chip enable terminal.

Connecting and wiring between the above IC chips will be described with reference to $A_1$, $A_2$ and $A_3$.

As shown in FIG. 2(A), twenty connecting terminals provided along edge $c_2$ of IC chip $A_2$ are connected to respective bonding patterns $n_2$, and twenty connecting terminals provided along edge $d_2$ are connected to respective through-hole patterns $m_2$ each by wire bonding. In a similar way, as for IC chip $A_3$, connecting terminals along edge $c_3$ are connected to respective bonding patterns $n_3$, and connecting terminals along edge $d_3$ are connected to respective through-hole patterns $m_3$ each by wire bonding. Half (ten in number) of bonding patterns $n_2$ connected to connecting terminals of IC chip $A_2$ are connected to respective bonding patterns $n_3$ connected to the common connecting terminals of IC chip $A_3$, by means of ten upper surface patterns $a_1$ which are arranged on the upper part of IC chip $A_2$ so as to avoid through-hole patterns $m_2$, and the remaining bonding patterns $n_2$ are connected to the corresponding bonding patterns of IC chip $A_3$ by means of ten upper surface patterns $a_2$ which are arranged on the lower part of IC chip $A_2$. Furthermore through-hole patterns $m_2$ connected to connecting terminals of IC chip $A_2$, are directly connected to through-hole patterns $m_3$ of IC chip $A_3$ by means of lower surface patterns "b" arranged on the lower surface of substrate 50.

That is to say, the above-mentioned structure allows connections between common connecting terminals which are provided along one edge of each IC chip to be made on upper surface 50a to which IC chips are bonded. On lower surface 50b where no IC chip exists, connections between common connecting terminals provided along the other edge of each IC chip are made, and at the same time the wiring of each individual connecting terminal is separately made all over the surface.

The above is the connection structure between the respective IC chips. Next, the entire connection structure will be described with reference to FIG. 1.

That is to say, twenty IC chips $A_1$ to $A_{20}$ are arranged and bonded in four rows in the arrangement direction of IC chips on substrate 50, as shown by arrow B. At this time, by reversing the direction of IC chips every row, as shown by arrows in the IC chips, the IC chips can be connected on the same plane without crossing the connections between IC chips throughout each of rows.

As mentioned above, the conventional memory card is designed so that many IC chips are directly packaged on a single circuit board. Therefore, wiring between common connecting terminals must be divided into the upper surface and the lower surface of the substrate. As a result, since the circuit board needs a lot of through-hole patterns and high-density wiring patterns, there are problems of increased costs caused by a costly process for making through-hole patterns and of decreased yields caused by high-density packaging of IC chips onto high-density wiring patterns.

On the other hand, by use of a single-sided print board, it is possible to make all connections between common connecting terminals on the IC chip bonding surface, but this requires considerably wide wiring space on both sides of an IC chip, and therefore, it is necessary to make an arrangement, with the distance between IC chips kept long. As a result, there causes a problem that the number of IC chips being mountable on a single card is limited.

The object of the present invention is to provide an IC package which is free of the above problems, low in cost and has a high packaging density.

SUMMARY OF THE INVENTION

The structure of the present invention for accomplishing the above object is as follows: An IC package comprising: (a) a main board including a plurality of external connecting terminal patterns aligned along one of the edges of the board, and a plurality of wiring patterns running in a row direction of the board on at least a front side of the board, the external connecting terminal patterns and the wiring patterns being connected by means of wiring patterns without crossing each other on the front side of the board; and (b) a plurality of IC chip units each having a single auxiliary board and a plurality of IC chips mounted on a front side of the single auxiliary board, the auxiliary board being rectangular and including a plurality of unit-connecting terminal patterns aligned along one of the longitudinal edges of the auxiliary board, the auxiliary board unit-connecting terminal patterns corresponding to the plurality of main board row-direction wiring patterns, the auxiliary board further including plural columns of wiring patterns running in a column direction of the auxiliary board, and the plurality of IC chips being mounted on the plural columns of wiring patterns and aligned along the plurality of unit-connecting terminal patterns; (c) the plurality of IC chip units being mounted on the main board, in a plurality of columns in parallel with the main board external connecting terminal patterns and the auxiliary board unit-connecting terminal patterns being electrically connected to corresponding ones of the main board row-direction wiring patterns.

BRIEF DESCRIPTION OF THE DRAWINGS

FIGS. 3 to 5 show a first embodiment of the present invention, in which:

FIG. 3 is a plan view thereof;

FIGS. 4(A) and 4(B) are a plan view and a sectional view of the first chip unit $B_1$;

FIG. 5(A) is a plan view of the circuit board and FIG. 5(B) is a back view thereof;

FIGS. 6 to 7 show a second embodiment of the present invention, in which:

FIG. 6(A) is a plan view thereof;

FIG. 6(B) is a sectional view taken along the line VIB—VIB of FIG. 6(A);

FIG. 7(A) is a plan view of the circuit board and FIG. 7(B) is a back view thereof;

FIGS. 8 to 10 show a third embodiment of the present invention, in which:

FIG. 8(A) is a plan view thereof;

FIG. 8(B) is a sectional view taken along the line VIIIB—VIIIB of FIG. 8(A);

FIG. 9 is a plan view of one of the chip units $B_{101}$, $B_{102}$, $B_{103}$ and $B_{104}$ of FIG. 8(B);

FIG. 10(A) is a plan view of the circuit board and FIG. 10(B) is a back view thereof;

FIGS. 11(A) and 11(B) show a fourth embodiment of the present invention, in which:

FIG. 11(A) is a plan view of the circuit board and FIG. 11(B) is a back view thereof;

FIGS. 12(A) and 12(B) are a plan view and a sectional view of a modified embodiment of the chip unit.

DETAILED DESCRIPTION OF THE PREFERRED EMBODIMENTS

The embodiments of the present invention will now be described in detail with reference to the drawings.

Figure 1:
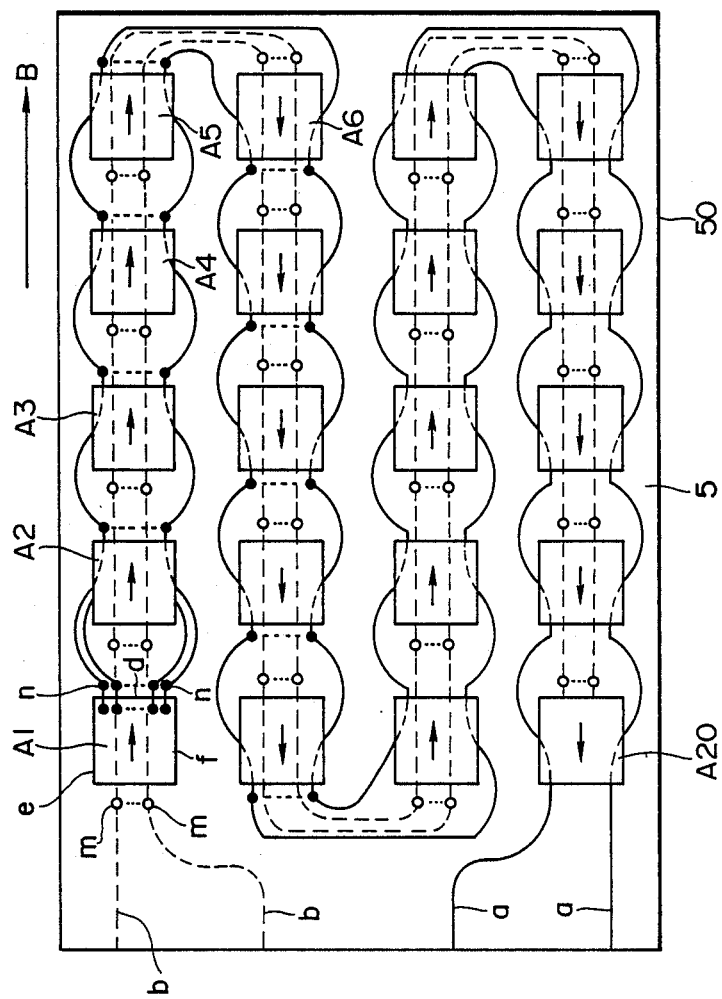
FIG. 1 is a plan view of a conventional memory card.
Figure 2:
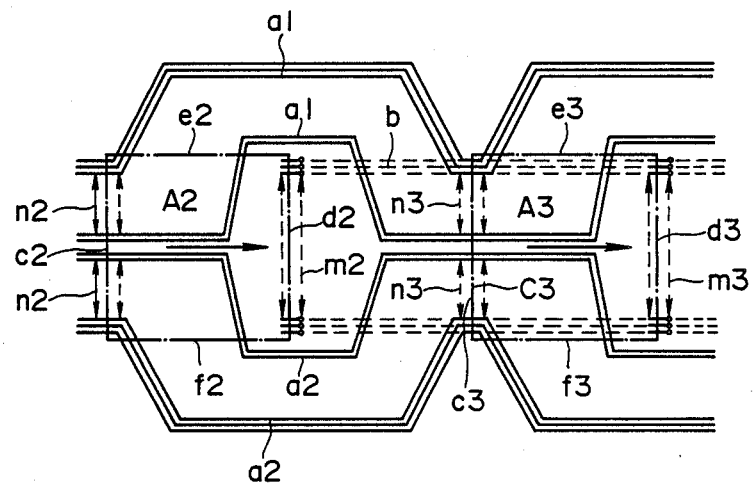
FIGS. 2(A) and 2(B) are a partially plan view and a partially sectional view of the conventional memory card.
Figure 2:
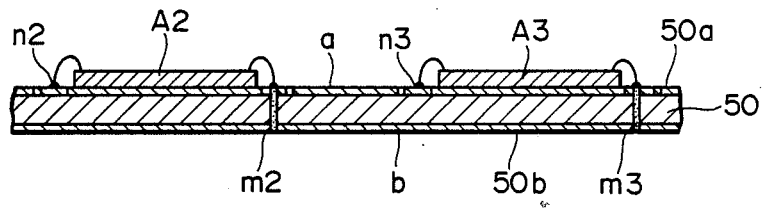
Figure 3:
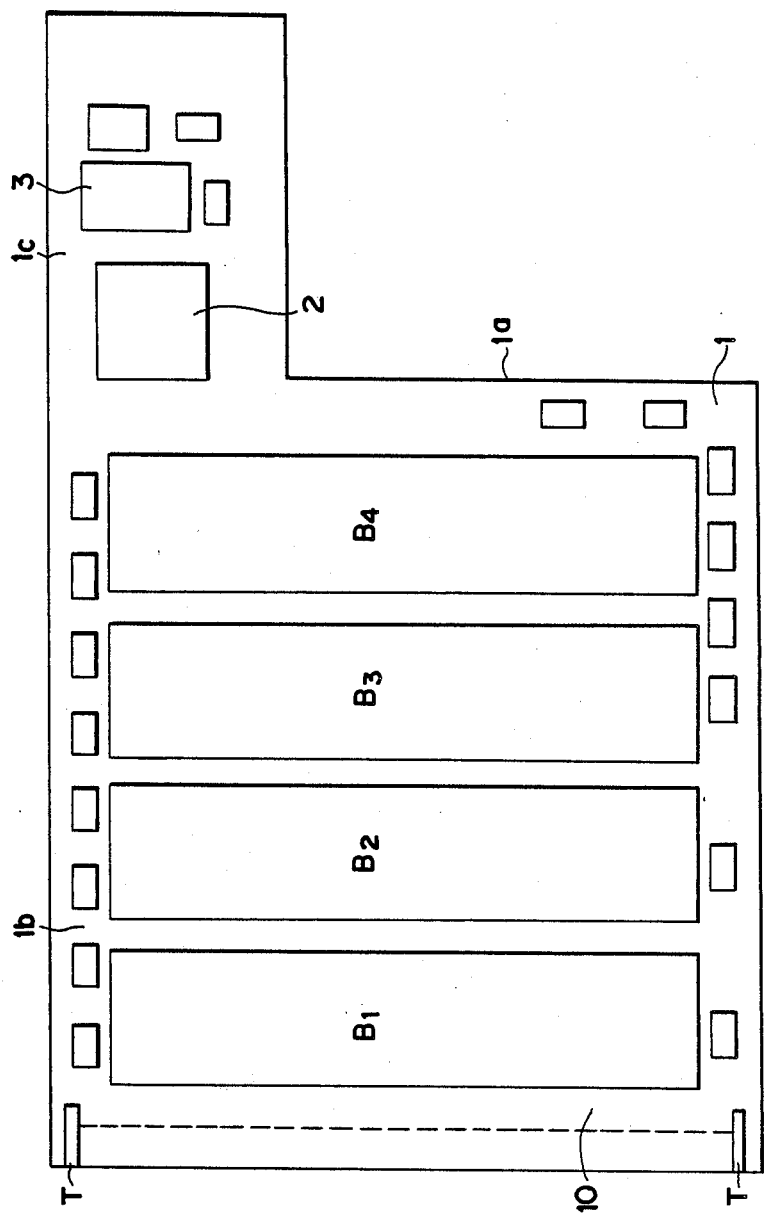

FIG. 3 is a plan view of a memory card of a first embodiment of the present invention; a circuit board 1 which forms a memory card 10 is provided with a cut-out portion 1a for holding a power supply device; a memory package portion 1b; and a decoder (chip selecting circuit) package portion 1c. Along one edge of the memory package portion 1b, a plurality of external connecting terminals T are provided.

On the memory package portion 1b of the circuit board 1, four chip units $B_1$, $B_2$, $B_3$ and $B_4$ as will be discussed later are aligned, and a plurality of chip components are arranged around the chip units. Also on the decoder package portion 1c, elements such as a decoder IC 2 and a capacitor 3 are packaged.

FIGS. 4(A) and 4(B) are a plan view and a sectional view of the chip unit $B_1$ shown in FIG. 3. The chip unit $B_1$ has four memory IC chips $D_1$ to $D_4$ packaged as one group on an auxiliary board 4 and encapsulated with an encapsulating resin 6. Along one edge of the longitudinal direction of the auxiliary board 4, a plurality of unit-connecting terminals t are provided and they are divided into four blocks $t_1$ to $t_4$. As for the respective blocks $t_1$ to $t_4$ of the unit-connecting terminals t, the respective connecting terminals of the four IC chips $D_1$ to $D_4$ are connected in common by means of common connecting patterns on the auxiliary board 4. Some common connecting patterns are connected to the unit-connecting terminals via front wiring patterns, and the other common connecting patterns are connected to the unit-connecting terminals via through-hole patterns which lead to the back and via back wiring patterns. In addition, each block is provided with a chip enable connecting terminal te (CE connecting terminal) for connecting each of chip enable terminals of IC chips $D_1$ to $D_4$.

That is to say, the number of the unit-connecting terminals t of the chip unit $B_1$ reaches a total of thirty-two (the twenty-eight common connecting terminals and four chip enable terminals, each enable terminal being provided in each of IC chips D to $D_4$). These thirty-two terminals are divided into the respective blocks $t_1$ to $t_4$, each eight.

All the chip units $B_2$, $B_3$ and $B_4$ shown in FIG. 3 are of the same construction as chip unit $B_1$ including the number and arrangement of unit-connecting terminals.

Figure 5:
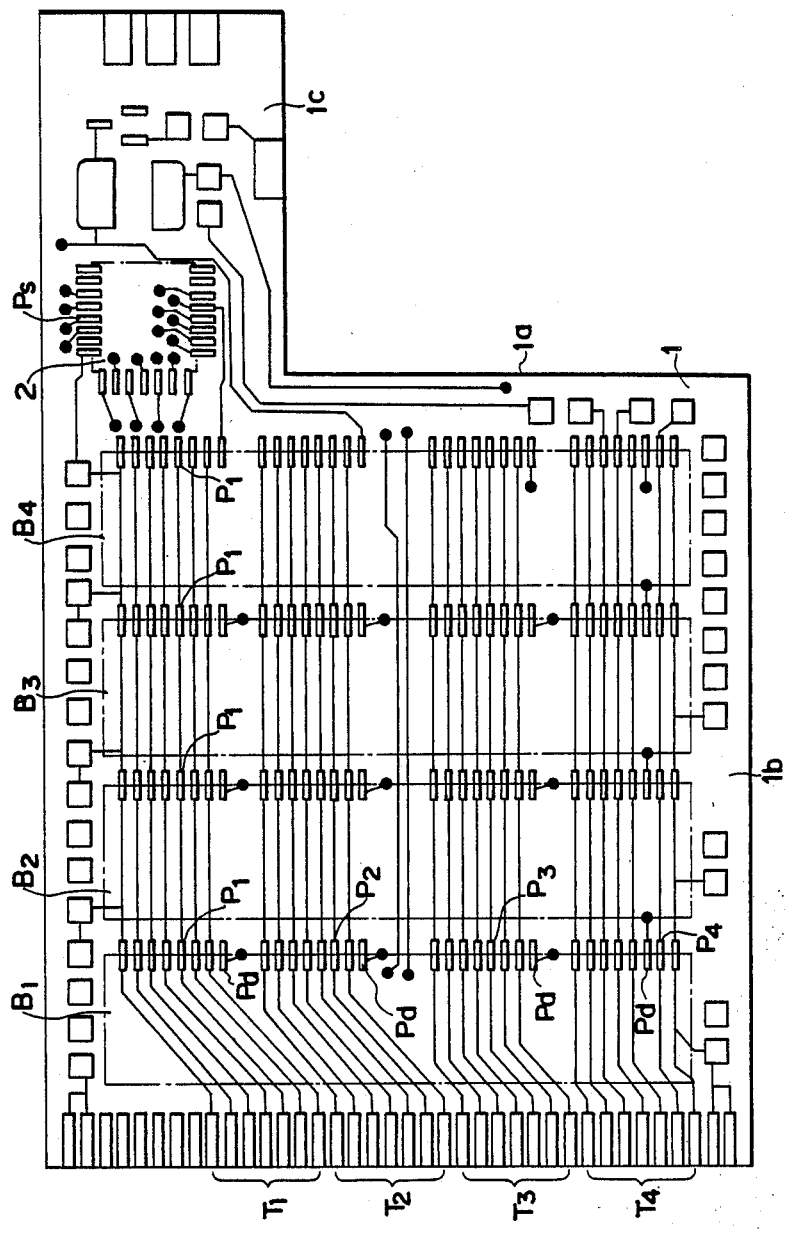
Figure 5:
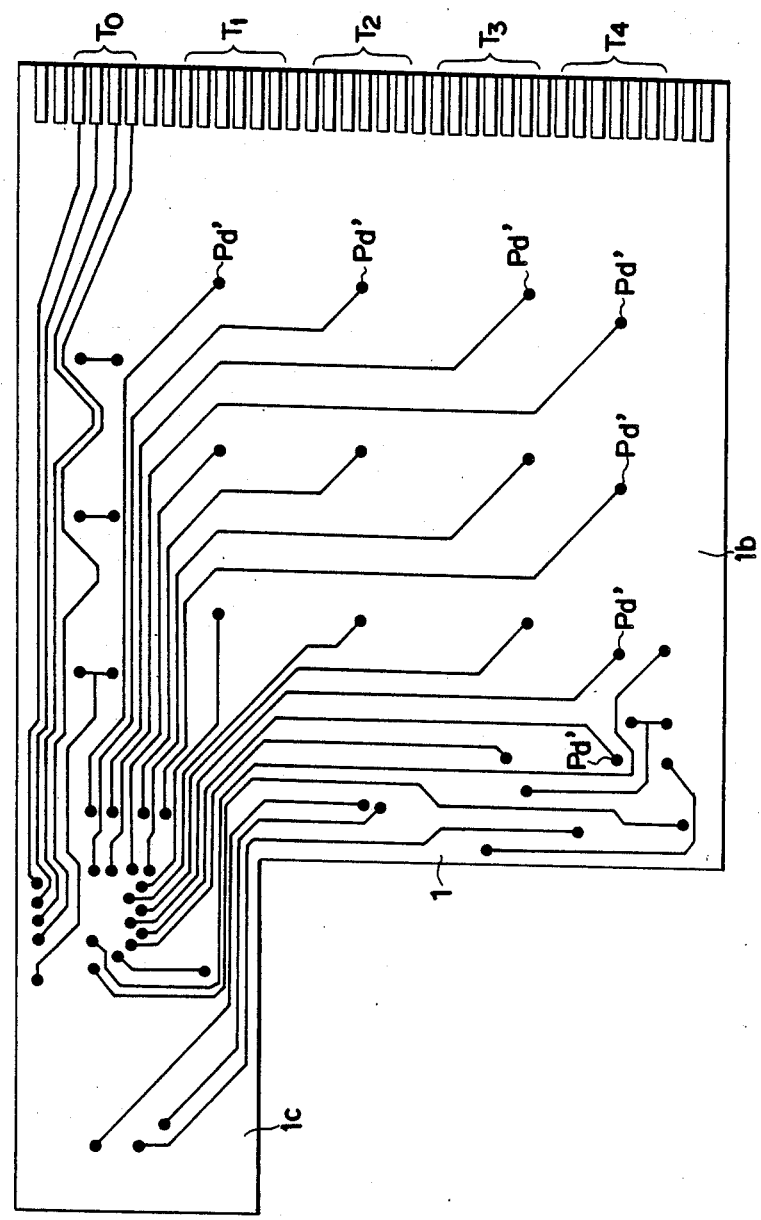

FIGS. 5(A) and 5(B) are a front view and a back view of the circuit board 1 shown in FIG. 3 and show wiring patterns respectively. As shown in FIG. 5(A), the memory package portion 1b on the front of the circuit board 1 is formed with bonding patterns $P_1$, $P_2$, $P_3$, $P_4$ and $P_d$ corresponding to the positions of the respective unit-connecting terminals $t_1$, $t_2$, $t_3$, $t_4$ and $t_e$ when chip units $B_1$, $B_2$, $B_3$ and $B_4$ shown in FIG. 3 are aligned as shown by dot and dash lines, and common bonding patterns $P_1$, $P_2$, $P_3$ and $P_4$ for each chip unit $B_1$, $B_2$, $B_3$ and $B_4$ and external connecting terminals $T_1$, $T_2$, $T_3$ and $T_4$ corresponding to bonding patterns $P_1$, $P_2$, $P_3$ and $P_4$ are connected in common by means of wiring patterns.

Also on the decoder package portion 1c, as shown by a dot and dash line, the decoder IC (chip selecting circuit) 2 is packaged by means of bonding patterns Ps.

Next, the packaging and connecting/wiring on the memory package portion 1b will be explained, taking, as an example, the chip unit $B_1$. The unit-connecting terminals $t_1$, $t_2$, $t_3$ and $t_4$ of the chip unit $B_1$ which is mounted on the position shown by the dot and dash line are located on the bonding patterns $P_1$, $P_2$, $P_3$ and $P_4$ on the circuit board 1. By soldering the terminals in this state, the packaged state shown in FIG. 3 is established.

As a result, to each chip enable bonding pattern Pd (CE bonding pattern) provided in each block of bonding patterns, each CE connecting terminal te provided in each block of unit-connecting terminals of chip unit $B_1$ is soldered and connected via a through-hole pattern to the back of the circuit board 1.

On the other hand, the respective bonding patterns $P_1$, $P_2$, $P_3$ and $P_4$ except CE bonding patterns $P_d$ are connected to the respective blocks of $T_1$, $T_2$, $T_3$ and $T_4$ of the corresponding external connecting terminals.

In a similar way, by packaging the other chip units $B_2$, $B_3$ and $B_4$, common unit-connecting terminals of each chip unit are linearly connected by means of the wiring patterns, and by conforming bonding patterns $P_1$, $P_2$, $P_3$ and $P_4$ to external connecting terminals $T_1$, $T_2$, $T_3$ and $T_4$ in arrangement and procedure, plane connections can be made without crossing connections.

Furthermore, as shown in FIG. 5(B), the back of the circuit board 1 is provided with through-hole patterns $P_d'$ connected to the front CE bonding patterns $P_d$. All the CE connecting terminals $t_e$ are connected via through-hole patterns $P_d'$ to the decoder IC (chip selecting circuit) 2 by means of the wiring patterns. Then, the decoder IC 2 is supplied with the decoder (chip selecting circuit) control signals via external connecting terminals $T_0$ for enable control of IC chips packaged on each of the chip units.

As mentioned above, the chip unit structure in which a plurality of IC chips are compactly packaged allows the wiring density on the circuit board 1 to be decreased, and the number of through-hole patterns and the number of soldering terminals are remarkably decreased.

As an example, the case where four chip units are packaged on a circuit board (one chip unit comprises four IC chips each having 29 terminals) is compared with the case of the conventional independent IC chip packaging in the number of soldering operations:
Conventional example: 29 terminals $\times$ 16 chips = 464 soldering operations
Present invention: 32 terminals $\times$ 4 units = 128 soldering operations The number of soldering operations of the present invention is less than $\frac{1}{3}$ of that of the conventional example.

As a result, the number of wires and the number of through-hole patterns can be considerably decreased, and a large space between wiring patterns can be provided.

Also, by conforming the unit-connecting terminals of each chip unit to the external connecting terminals of the circuit board 1 in arrangement and procedure, the planeness and the linearity of wiring patterns have been realized, and soldering has been made easy. Furthermore, by checking the reliability in the chip unit block, the packaging yield onto the circuit board 1 can be remarkably improved. Therefore, the conventional poor total yield caused by the high-density wiring and a lot of bonding operations in IC chip independent packaging can be improved.

Figure 7:
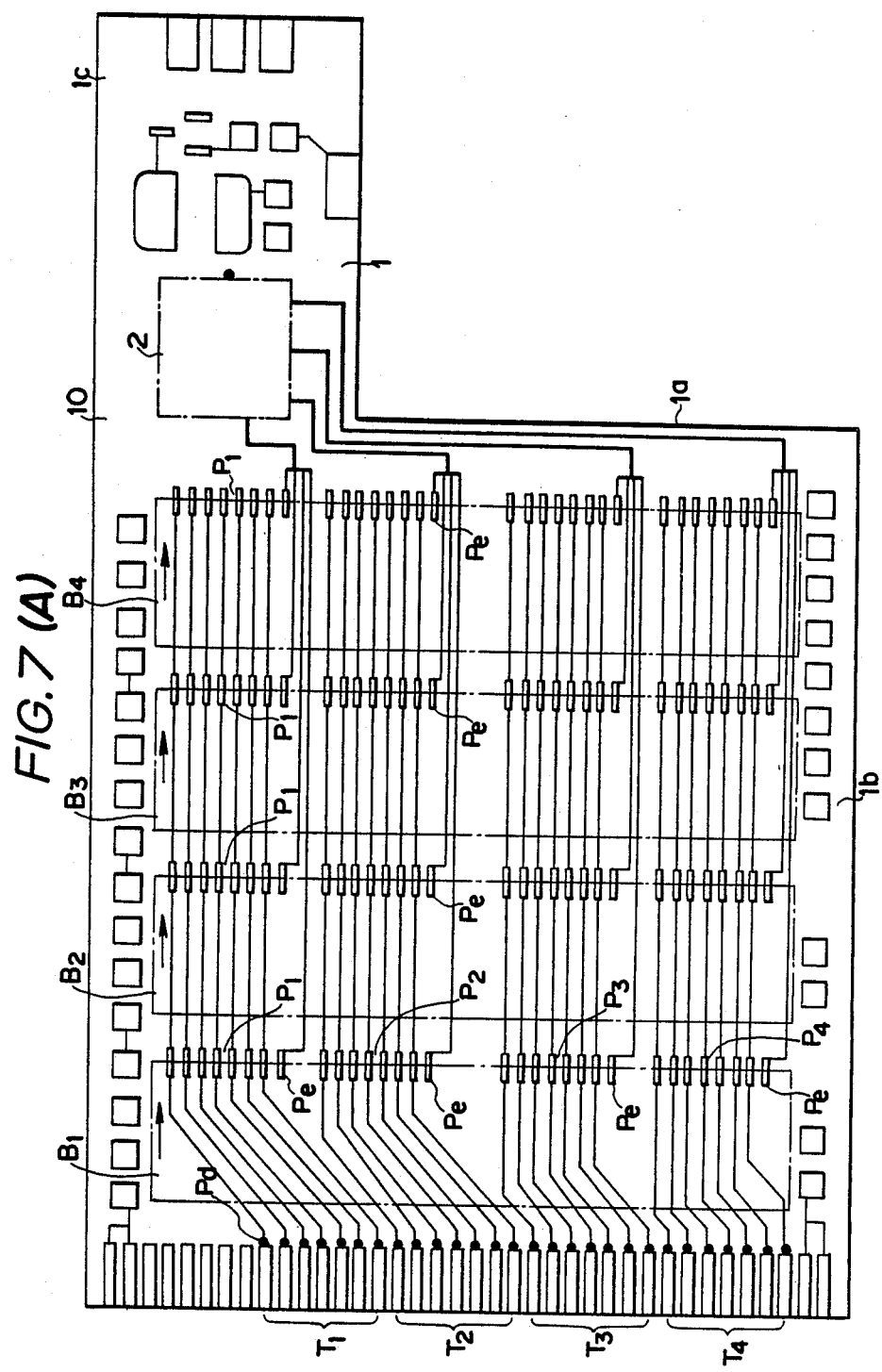
Figure 7:
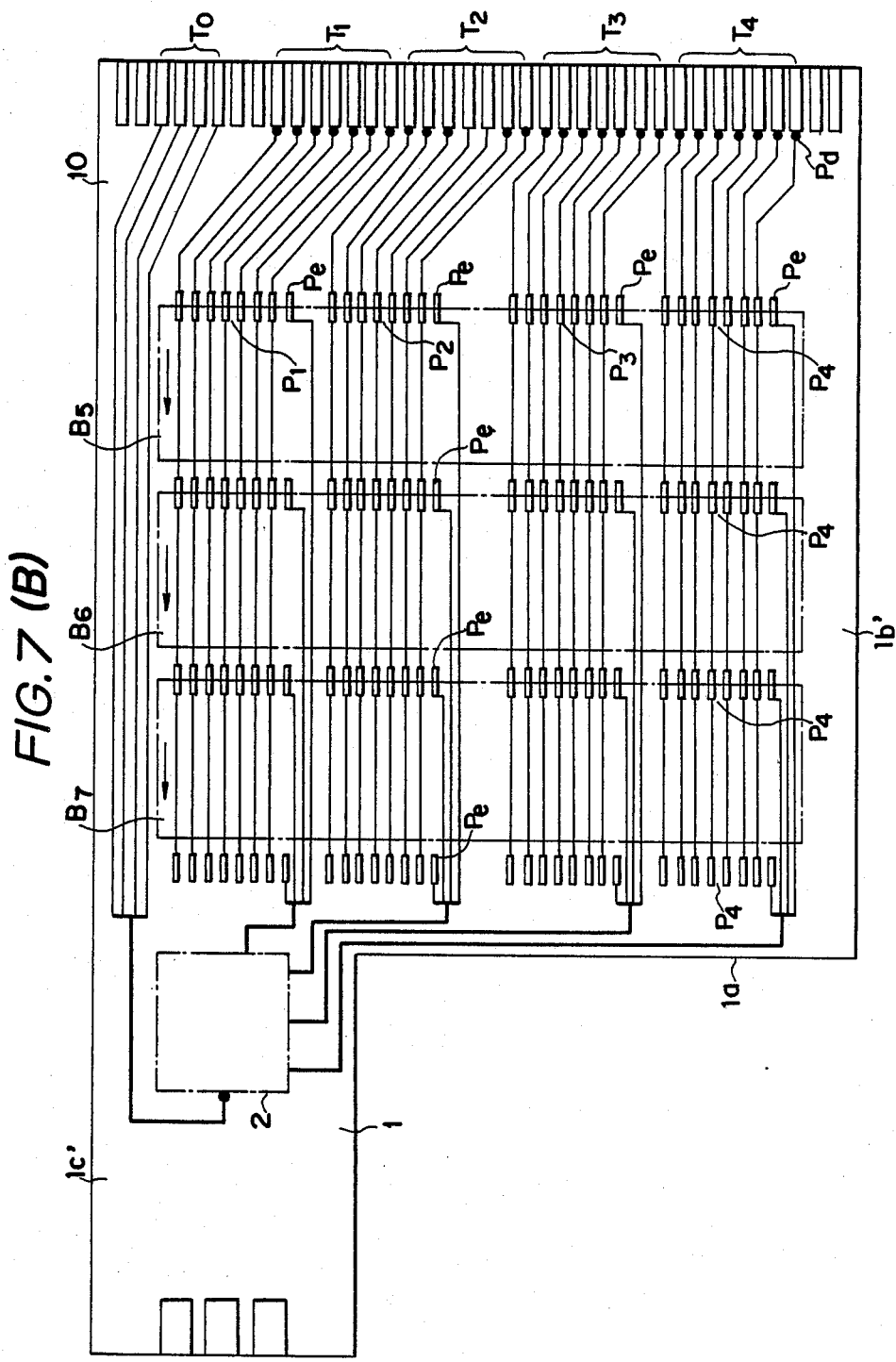

FIGS. 6 and 7 show a memory card according to the second embodiment of the invention, in which FIG. 6(A) is a plan view thereof and FIG. 6(B) is a sectional view taken along the line VIB—VIB of FIG. 6(A). As can be seen from the figures, the memory package portion $1b$ on the front side of the circuit board 1 is provided with the chip units $B_1$, $B_2$, $B_3$ and $B_4$ identical with those discussed with reference to FIGS. 4(A) and 4(B) (first embodiment), and the memory package portion $1b'$ on the back side of the circuit board 1 is provided with chip units $B_5$, $B_6$ and $B_7$.

FIGS. 7(A) and 7(B) are a front view and a back view of the circuit board 1 shown in FIG. 6(A) and show wiring patterns respectively. As shown in FIG. 7(A), the memory package portion $1b$ on the front of the circuit board 1 is formed with bonding patterns $P_1$, $P_2$, $P_3$, $P_4$ and $P_e$ corresponding to the positions of the respective unit-connecting terminals $t_1$, $t_2$, $t_3$, $t_4$ and $t_e$ when chip units $B_1$, $B_2$, $B_3$ and $B_4$ are aligned as shown in FIG. 6(A) by dot and dash lines, and common bonding patterns $P_1$, $P_2$, $P_3$ and $P_4$ for each chip unit $B_1$, $B_2$, $B_3$ and $B_4$ and external connecting terminals $T_1$, $T_2$, $T_3$ and $T_4$ corresponding to bonding patterns $P_1$, $P_2$, $P_3$ and $P_4$ are connected in common by means of wiring patterns.

Also on the decoder package portion $1c$, as shown by a dot and dash line, the decoder IC (chip selecting circuit) 2 is packaged and to this decoder IC 2, the respective chip enable bonding patterns $P_e$ (CE bonding patterns) of the bonding patterns $P_1$, $P_2$, $P_3$, $P_4$ and $P_e$ are connected.

As shown in FIG. 7(B), also on a memory package portion $1b'$ on the back of the circuit board 1, bonding patterns $P_1$, $P_2$, $P_3$, $P_4$ and $P_e$ are formed corresponding to the positions of the respective unit-connecting terminals $t_1$, $t_2$, $t_3$, $t_4$ and $t_e$ when chip units $B_5$, $B_6$ and $B_7$ are aligned as shown by dot and dash lines, and like the front memory package portion $1b$, common bonding patterns $P_1$, $P_2$, $P_3$ and $P_4$ for each chip unit $B_5$, $B_6$ and $B_7$ and the external connecting terminals $T_1$, $T_2$, $T_3$ and $T_4$ corresponding to these bonding patterns $P_1$, $P_2$, $P_3$ and $P_4$ are connected in common by means of wiring patterns. Moreover, when the front external connecting terminals $T_1$, $T_2$, $T_3$ and $T_4$ and the back external connecting terminals $T_1$, $T_2$, $T_3$ and $T_4$ are connected by means of through-hole patterns $P_d$, all the common bonding patterns $P_1$, $P_2$, $P_3$ and $P_4$ for each chip unit on the front and the back are connected in common. On a decoder package portion $1c'$, to back patterns of the decoder IC 2, the respective CE bonding patterns $P_e$ are connected and part of the back patterns are in turn connected to external connecting terminals $T_0$.

Next, the packaging and connecting/wiring on the memory package portions $1b$ and $1b'$ will be explained, taking, as an example, the chip units $B_1$ and $B_5$. In FIG. 7(A), the unit-connecting terminals $t_1$, $t_2$, $t_3$ and $t_4$ (FIG. 4(A)) of the chip unit $B_1$ which is mounted on the position shown by the dot and dash line, with the unit-connecting terminals placed in the direction of arrow, are located on the bonding patterns $P_1$, $P_2$, $P_3$ and $P_4$ on the circuit board 1. By soldering the terminals in this state, the packaged state shown in FIG. 6(A) is established.

On the other hand, the respective bonding patterns $P_1$, $P_2$, $P_3$ and $P_4$ except CE bonding patterns $P_e$ are, as mentioned above, connected to the respective blocks of $T_1$, $T_2$, $T_3$ and $T_4$ of the corresponding external connecting terminals.

In a similar way, by packaging the other chip units $B_2$, $B_3$ and $B_4$, common unit-connecting terminals of each chip unit are linearly connected by means of the wiring patterns, and by conforming bonding patterns $P_1$, $P_2$, $P_3$ and $P_4$ to external connecting terminals $T_1$, $T_2$, $T_3$ and $T_4$ in arrangement and procedure, plane connections can be made without crossing connections.

Next, in FIG. 7(B), as shown by dot and dash lines, chip units $B_5$ to $B_7$ identical with the front chip units $B_1$ to $B_4$ are mounted, with the connecting terminals placed in the direction opposite to the direction shown by the arrows for the chip units $B_1$ to $B_4$. In this state, the respective unit-connecting terminals $t_1$, $t_2$, $t_3$ and $t_4$ of chip unit $B_5$ are located on the bonding patterns $P_1$, $P_2$, $P_3$ and $P_4$ on the circuit board 1. By soldering, the packaged condition in FIG. 6(A) is established.

On the memory package portions 1b and 1b' of the circuit board 1, external connecting terminals $T_1$, $T_2$, $T_3$ and $T_4$ of both portions are connected by means of through-hole patterns $P_d$. Also all the CE connecting terminals $t_e$ are connected via EC bonding patterns $P_e$ to the decoder IC 2 by means of the wiring patterns. Then, the decoder IC 2 is supplied with the decoder control signals via external connecting terminals $T_0$ for enable control of IC chips packaged on each of the chip units.

As mentioned above, on the front and back of the circuit board 1, similar wiring patterns are formed, and the corresponding patterns are connected by means of a series of through-hole patterns. As a result, the same chip units can be packaged on both the surfaces of the circuit board 1.

Also by conforming the unit-connecting terminals $t_1$, $t_2$, $t_3$ and $t_4$ of each chip unit to the external connecting terminals $T_1$, $T_2$, $T_3$ and $T_4$ of the circuit board 1 in arrangement and procedure, the planeness and the linearity of wiring patterns have been realized, and soldering has been made easy.

Figure 9:
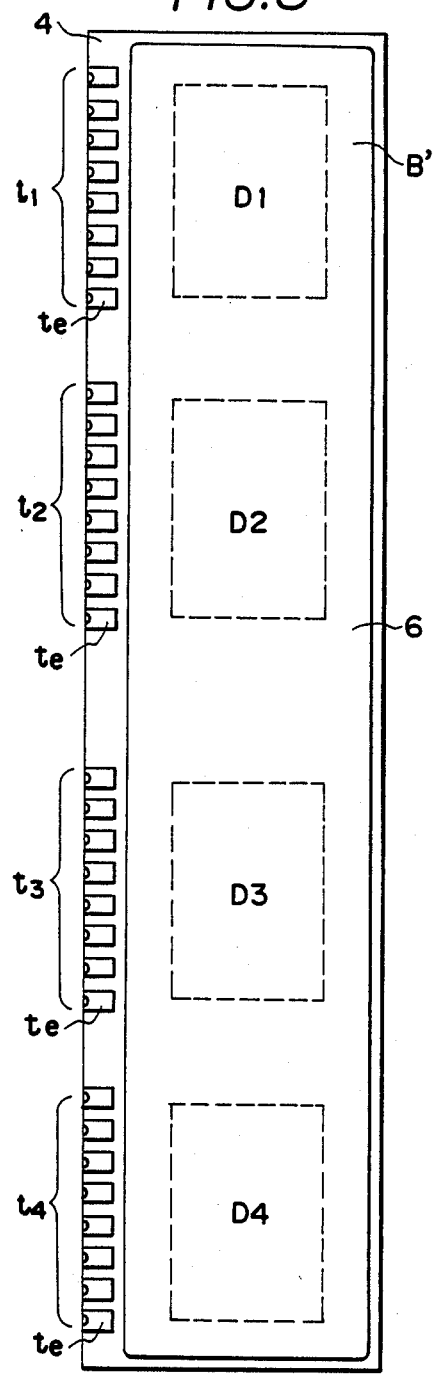

FIGS. 8 to 10 show a memory card according to the third embodiment of the invention, in which FIG. 8(A) is a plan view thereof and FIG. 8(B) is a sectional view taken along the line VIIIB—VIIIB of FIG. 8(A). As can be seen from the figures, the memory package portion 1b on the front of the circuit board is provided with the first chip units (those shown in FIGS. 4(A) and 4(B)) identical with the chip units of the first and the second embodiments. However, on the memory package portion 1b' on the back side of the circuit board, the second chip units $B_{101}$, $B_{102}$, $B_{103}$ and $B_{104}$ different from the chip units in the above embodiments are aligned, as will be discussed later.

The plan view of the circuit board 1 shown in FIG. 10(A) is identical with the plan view of the circuit board 1 according to the second embodiment (FIG. 7(A)).

As shown in FIG. 10(A), the memory package portion 1b on the front of the circuit board 1 is formed with bonding patterns $P_1$, $P_2$, $P_3$, $P_4$ and $P_e$ corresponding to the positions of the respective unit connecting terminals $t_1$, $t_2$, $t_3$, $t_4$ and $t_e$ when chip units $B_1$, $B_2$, $B_3$ and $B_4$ shown in FIG. 4(A) are aligned as shown by dot and dash lines, and common bonding patterns $P_1$, $P_2$, $P_3$ and $P_4$ for each chip unit and external connecting terminals $T_1$, $T_2$, $T_3$ and $T_4$ corresponding to bonding patterns $P_1$, $P_2$, $P_3$ and $P_4$ are connected in common by means of wiring patterns.

Also on the decoder package portion 1c, as shown by a dot and dash line, the decoder IC 2 is packaged and to this decoder IC 2, the respective chip enable bonding patterns $P_e$ (CE bonding patterns) of the bonding patterns $P_1$, $P_2$, $P_3$, $P_4$ and $P_e$ are connected.

FIG. 9 is a plan view of a second chip unit B' which forms each chip unit $B_{101}$, $B_{102}$, $B_{103}$ and $B_{104}$ shown in FIG. 8(B). The second chip unit B' is the same as the first unit B shown in FIG. 4(A) in the basic construction but different in the arrangement of connecting terminals.

That is to say, in the second chip unit B', the other edge in the longitudinal direction of the auxiliary board (the edge opposite to the first chip unit B ($B_1$, $B_2$, $B_3$ and $B_4$)) has a plurality of unit connecting terminals divided into four blocks $t_1$ to $t_4$.

Figure 10B:
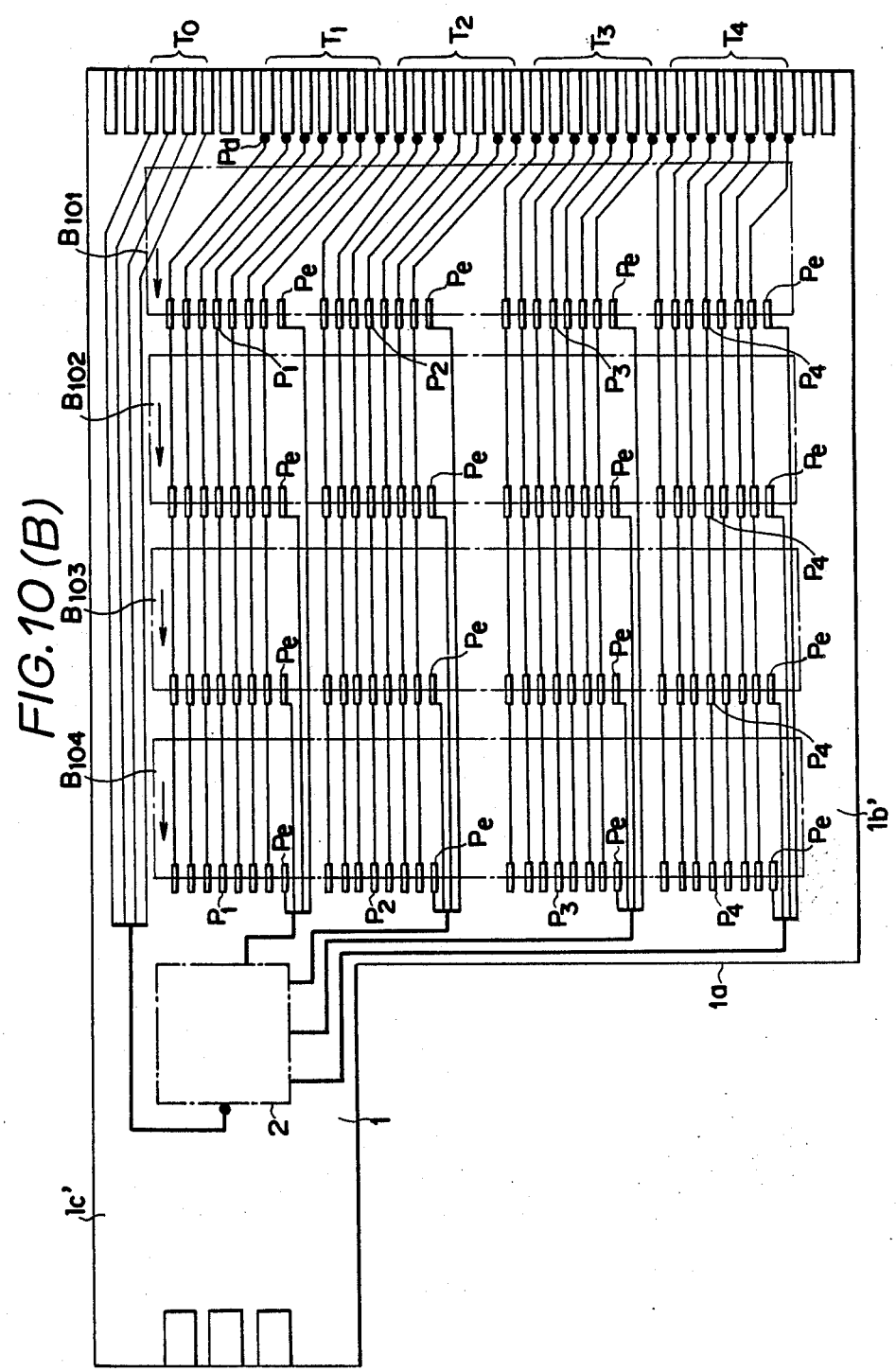

FIG. 10(B) is a back view of the circuit board 1 and shows the respective wiring patterns.

As shown in the figures, on the memory package portion 1b' on the back of the circuit board 1, bonding patterns $P_1$, $P_2$, $P_3$ and $P_4$ are formed corresponding to the positions of the respective unit connecting terminals $t_1$, $t_2$, $t_3$, $t_4$ and $t_e$ when chip units $B_{101}$, $B_{102}$, $B_{103}$ and $B_{104}$ are aligned as shown by dot and dash lines, and like the front memory package portion 1b, common bonding patterns $P_1$, $P_2$, $P_3$ and $P_4$ of each chip unit and the external connecting terminals $T_1$, $T_2$, $T_3$ and $T_4$ corresponding to these bonding patterns are connected in common by means of wiring patterns. Moreover, when the front external connecting terminals $T_1$, $T_2$, $T_3$ and $T_4$ and the back external connecting terminals $T_1$, $T_2$, $T_3$ and $T_4$ are connected by means of through-hole patterns $P_d$, all the common bonding patterns $P_1$, $P_2$, $P_3$ and $P_4$ of each chip unit on the front and the back are connected in common.

That is to say, in wiring patterns of memory package portions 1b and 1b' on the front and back of the circuit board 1, the bonding patterns $P_1$, $P_2$, $P_3$, $P_4$ and $P_e$ and external connecting terminals $T_1$, $T_2$, $T_3$ and $T_4$ are provided in corresponding positions on two sides of the circuit board.

On a decoder package portion 1c', each CE bonding pattern $P_e$ is connected to back patterns of the decoder IC 2, and part of the back patterns are in turn connected to external connecting terminals $T_0$.

Next, the packaging and connecting/wiring on the memory package portions 1b and 1b' will be explained.

In FIG. 10(A), the aforementioned chip units $B_1$ to $B_4$ are mounted on the positions each shown by a dot and dash line, with the chip units $B_1$, $B_2$, $B_3$ and $B_4$ placed in the direction of arrows. As a result, the unit-connecting terminals $t_1$, $t_2$, $t_3$ and $t_4$ of each chip unit $B_1$ to $B_4$, are located on the bonding patterns $P_1$, $P_2$, $P_3$ and $P_4$ on the circuit board 1. By soldering the terminals in this state, the packaged state shown in FIG. 8(A) is established.

As a result, to each CE bonding pattern $P_e$ provided in each block of bonding patterns, each CE connecting terminal $t_e$ provided in each block of unit-connecting terminals of chip units $B_1$ to $B_4$ is soldered. On the other hand, the respective bonding patterns $P_1$, $P_2$, $P_3$ and $P_4$ except CE bonding patterns $P_e$ are, as mentioned above, connected to the respective blocks of $T_1$, $T_2$, $T_3$ and $T_4$ of the corresponding external connecting terminals.

By packaging as mentioned above, the common unit-connecting terminals of each chip unit are linearly connected by means of the wiring patterns, and by conforming bonding patterns $P_1$, $P_2$, $P_3$ and $P_4$ to external connecting terminals $T_1$, $T_2$, $T_3$ and $T_4$ in arrangement and procedure, plane connections can be made without crossing connections.

Next, the packaging on the back side will be explained.

In FIG. 10(B), on the positions shown by dot and dash lines, the second chip units $B_{101}$ to $B_{104}$ are mounted, with the connecting terminals placed in the direction shown by the arrows. As a result, the respective unit-connecting terminals $t_1$, $t_2$, $t_3$ and $t_4$ of chip units $B_{101}$ to $B_{104}$ are located on the bonding patterns $P_1$, $P_2$, $P_3$ and $P_4$. By soldering in this state, the packaged condition in FIG. 8(B) is established.

As a result, like the front packaging, to CE bonding patterns $P_e$ each provided in the respective blocks of bonding patterns, the respective CE connecting terminals te provided in the respective blocks of unit-connecting terminals of chip units $B_{101}$ to $B_{104}$ are soldered. Also the respective bonding patterns $P_1$, $P_2$, $P_3$ and $P_4$ except CE bonding patterns $P_e$ are, as mentioned above, connected to the corresponding external connecting terminals $T_1$, $T_2$, $T_3$ and $T_4$.

That is to say, since the respective front and back bonding patterns $P_1$, $P_2$, $P_3$ and $P_4$ are directly connected by means of through-hole patterns $P_d$, their upper and lower arranged procedures correspond to each other. As shown by arrows in FIGS. 10(A) and 10(B), by mounting the respective chip units $B_1$ to $B_4$ and $B_{101}$ to $B_{104}$ in the corresponding positions, the correct connecting is made.

Also all the CE connecting terminals $t_e$ are connected via EC bonding patterns $P_e$ to the decoder IC 2 by means of the wiring patterns. Then, the decoder IC 2 is supplied with the decoder control signals via external connecting terminals $T_0$ for enable control of IC chip packaged on each of the chip units.

As mentioned above, on the front and back of the circuit board 1, the same wiring patterns are formed, and the corresponding patterns are connected by means of a series of through-hole patterns. At the same time, two types of chip units whose unit-connecting terminals are reversed in direction are packaged on both sides of the circuit board 1. As a result, the packaging density is remarkably enhanced.

Figure 11B:
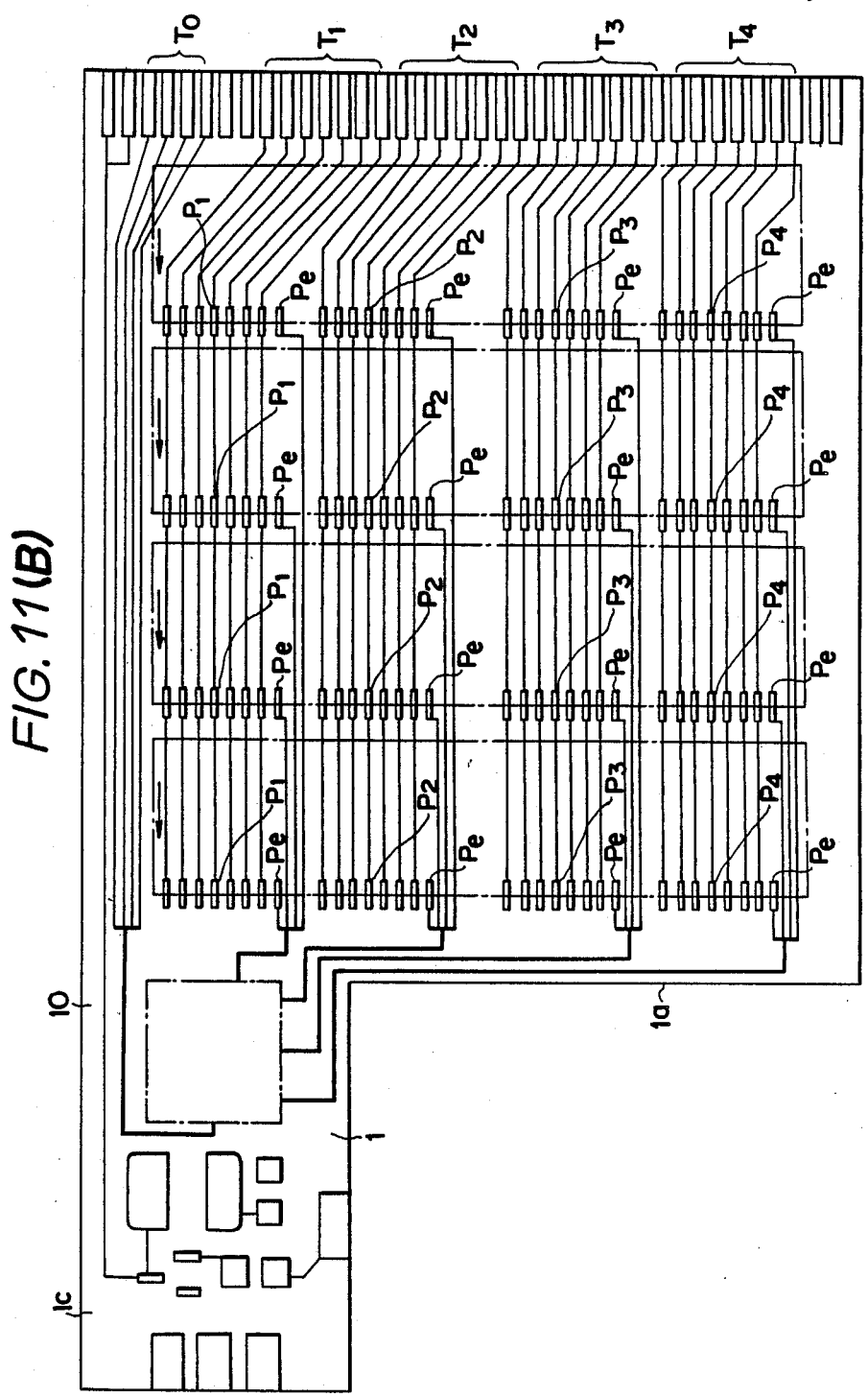

FIGS. 11(A) and 11(B) illustrate a fourth embodiment of the present invention, in which FIG. 11(A) is a plan view of the circuit board and FIG. 11(B) is a back view thereof. Connections between the external connecting patterns $T_0$ on the board and the input terminals of the decoder IC (chip selecting circuit) 2 and connections between the output terminals of the decoder and the chip enable terminals $P_e$ on the board are made by means of the wiring patterns on the board. As a result, connections between the board and the components to be mounted on the board can be made only on the front (one side) of the board. FIG. 11(B) shows its back side. Like the front side, connections between the board and the components to be mounted on the board can be made only on the back side (one side). In this embodiment, the back wiring patterns correspond to the front wiring patterns so as to make the arrangement similar to that of the third embodiment. However, since both the front and back sides are independent, they can be made into different types from each other.

FIGS. 12(A) and 12(B) are a plan view and a sectional view illustrating another embodiment of the chip unit B according to the present invention. This embodiment is different from the embodiment of FIG. 4 in that the encapsulating resin 6 is divided into an encapsulating resin block 6a for encapsulating IC chips $D_1$ and $D_2$ and an encapsulating resin block 6b for encapsulating IC chips $D_3$ and $D_4$ so as to be divided into a first block Ba and a second block Bb, with a center line K shown by a dashed line being a border, and in that a plurality of common connecting patterns L are exposed between the encapsulating resing blocks 6a and 6b of the auxiliary board 4.

The purpose of the aforementioned embodiment is to further improve the total yield by chip unit structure. The reliability of chip unit B is checked with reference to the first block Ba and the second block Bb. Should any one be found to be defective, the chip unit B is cut to separate along the center line K, and instead of the defective block, a good block is joined along the center line K and at the same time, common connecting patterns L are connected by a method such as soldering so as to complete a reproduced chip unit B.

That is to say, should one of the four IC chips packaged on the chip unit be defective, in the embodiment of FIG. 4(A), the four IC chips are discarded, but in the present embodiment, only two IC chips are discarded and the remaining two IC chips are saved. As a result, in the present embodiment, the total yield can be improved. In this respect, needless to say, the number of the IC chips packaged within the chip unit and the number of the chip units packaged on the circuit board can be selected at will.

Figure 13A:
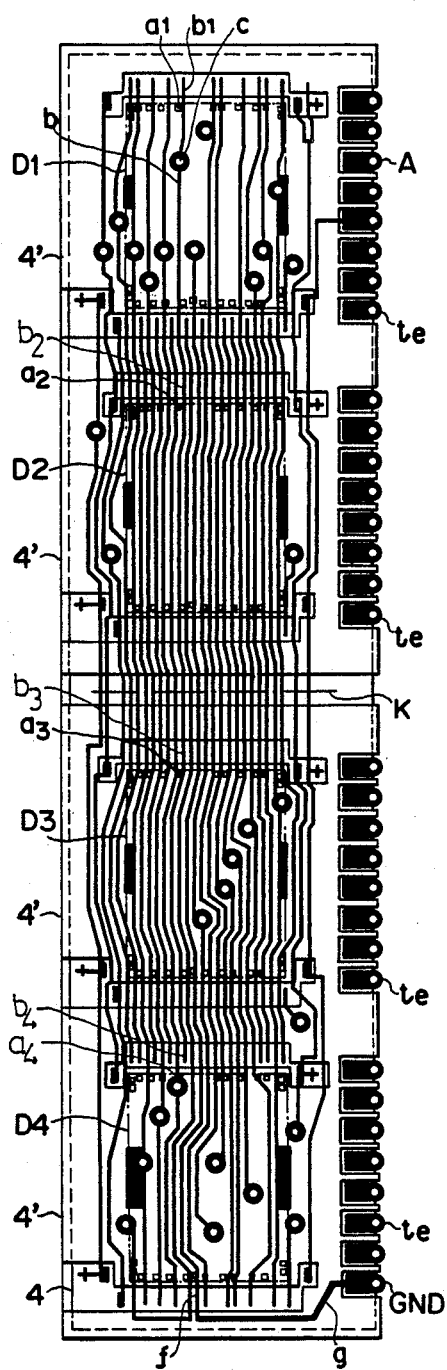
FIGS. 13(A) and 13(B) are a plan view and a back view of the auxiliary board of the chip unit of FIGS. 12(A) and 12(B).
Figure 13B:
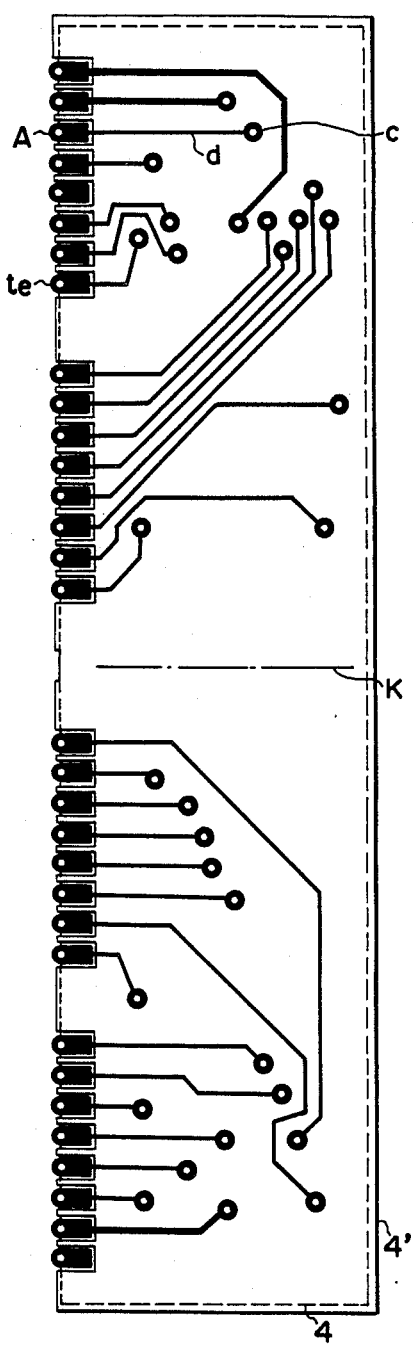

FIG. 13(A) is a plan view of the auxiliary board for the chip unit shown in FIG. 12(A) (mold and IC chips are removed), and FIG. 13(B) is its back view.

The auxiliary board 4 is rectangular, has unit-connecting terminal patterns along one edge of the longitudinal edges (right side in this embodiment) and the plural columns of wiring patterns which are in parallel with the aligned unit-connecting terminals. Each of the plural columns of wiring patterns, for example, b, is bonded to each of the corresponding terminals $a_1$, $a_2$, $a_3$ and $a_4$ of IC chips $D_1$, $D_2$, $D_3$ and $D_4$ mounted on the auxiliary board at the corresponding positions (bonding portions) $b_1$, $b_2$, $b_3$ and $b_4$. These bonding portions are made wider than the other portions for facilitating bonding operations. Like the front side, the back side is coated with an insulating coating 4' except the unit-connecting terminal patterns.

The wiring pattern b is provided with a through-hole pattern c leading to the back side. This through-hole pattern is connected to the back wiring pattern d and connected to the unit-connecting terminal pattern A by means of the back wiring pattern d.

Most of the column-direction wiring patterns are connected in a similar way. However, some pattern, e.g. a GND terminal is connected from a unit-connecting terminal pattern GND to the column-direction wiring pattern g by means of a separately provided front wiring pattern f. As can be seen from the figures, the surface of the auxiliary board 4 is coated with the insulating coating 4' except for the regions of the bonding portions of the front wiring patterns and the middle portion K. On this insulating coating 4', IC chips $D_1$, $D_2$, $D_3$ and $D_4$ are mounted and then molded with resin 6. Thus IC chips shown in FIG. 12 are completed.

As mentioned above, according to the invention, by aligning a single type or plural types of chip units having a plurality of IC chips packaged on one side or two sides of the auxiliary board, wiring and connecting density on the circuit board is decreased. Therefore, IC packaging density can be improved, and at the same time the reliability can be improved owing to the unit control. Thus, the present invention has a great effect on the improvement in the marketability of IC packages.

What is claimed is:

1. An IC package comprising:
   (a) a main board including;
      a plurality of row-direction common printed wiring patterns running in a row direction on at least a front side of said main board, said row-direction common printed wiring patterns being provided in groups,
      chip selecting printed terminal patterns each belonging to and provided near said respective groups of said printed wiring patterns, and a plurality of external connecting printed terminal patterns aligned along one of the edges of said main board, said plurality of external connecting printed terminal patterns having a plural number of external common printed connecting terminal patterns and a smaller number of external chip selecting control printed terminal patterns corresponding to said respective groups of rowdirection printed wiring patterns, said respective groups of row-direction common printed wiring patterns being connected to the corresponding external common connecting printed terminal patterns by means of printed wiring patterns without crossing each other on the front side of said main board, (b) a plurality of IC chip units each including;

a single auxiliary board and a plurality of IC chips mounted in a column on said auxiliary board, said single auxiliary board extending in a column direction and being rectangular;

said IC chips each having a plural number of common connecting terminals and a smaller number of chip selecting terminals and being of the substantially same type;

said auxiliary board including;

a plurality of column-direction common printed wiring patterns running in a column direction corresponding to said common connecting printed terminals of said IC chips on a front side of said auxiliary board;

chip selecting printed terminal patterns corresponding to said respective IC chips; and unit connecting printed terminal patterns provided in a column along one of the edges in parallel with said column-direction common printed wiring patterns of said auxiliary board, said unit connecting printed terminal patterns including;

unit common connecting printed terminal patterns provided corresponding to said row-direction common printed wiring patterns provided in groups on said main board; and unit chip selecting printed terminal patterns provided corresponding to the chip selecting printed terminal patterns on said main board;

said common connecting terminals of said respective IC chips being connected to said respective column-direction common printed wiring patterns on the corresponding auxiliary board, and said chip selecting terminals of said respective IC chips being connected to the corresponding chip selecting printed terminal patterns on said auxiliary board, said column-direction common printed wiring patterns on said auxiliary board being connected to said unit common connecting printed terminal patterns, and said respective chip selecting printed terminal patterns on said auxiliary board being connected to said unit chip selecting printed terminal patterns, (c) said plurality of IC chip units being superimposed on each other on said main board so that said plurality of IC chip units are arranged in parallel with each other and that the column-direction printed wiring patterns of the respective IC chip unit are perpendicular to the row-direction printed wiring patterns on the main board;

said respective unit common connecting printed terminal patterns being electrically connected to said corresponding row-direction common printed wiring patterns on the main board; and the respective unit chip selecting printed terminal patterns being electrically connected to the corresponding chip selecting printed terminal patterns on the main board; and (d) at least one chip selecting circuit provided on said main board, input terminals of said chip selecting circuit being connected to said external chip selecting control printed terminal patterns, and output terminals of said chip selecting circuit being connected to said chip selected printed terminal patterns on the main board.

2. The IC package according to claim 1 wherein said auxiliary board is covered with an insulating coating except for the regions of said unit connecting patterns and said bonding portions.

3. The IC package according to claim 1 wherein said IC chips mounted on said auxiliary board are divided into at least two blocks and molded with resin respectively, the wiring patterns between said plurality of molds being stripped from said molding resin.

4. The IC package according to claim 3 wherein an even number of IC chips are mounted, divided into each equal number of IC chips and molded with resin, said column-direction wiring patterns being exposed from said resin at the middle portion of the auxiliary board.

5. The IC package according to claim 1, further comprising back-side printed wiring patterns corresponding in shape to said front-side common printed wiring patterns connected by means of through-hole patterns on a back side of said main board, in which on said printed wiring patterns on said front and back sides of said main board, IC chip units identical with said IC chip units are mounted.

6. The IC package according to claim 1, further comprising back-side printed wiring patterns corresponding in shape to said front-side common printed wiring patterns connected by means of through-hole patterns on a back side of said main board, in which on a back side of said main board, IC chip units provided with unit printed terminal patterns along an edge opposite to said IC chip units mounted on said front side are mounted.

7. The IC package according to claim 5 or 6, further comprising back-side row-direction common printed wiring patterns corresponding in shape to said front-side row-direction common printed wiring patterns connected by means of said through-hole patterns; back-side chip selecting terminal patterns; and a back-side chip selecting circuit, in which connections between said input terminal of said back-side chip selecting circuit and said main board external chip selecting control terminal patterns and connections between said output terminal of said back-side chip selecting circuit and said back-side chip selecting terminal patterns are independently made on the front side of said main board.

8. The IC package according to claim 1 wherein on said main board row-direction printed wiring patterns, there are provided bonding portions formed wide enough to allow bonding at positions corresponding to the unit-connecting printed terminal patterns of said plurality of IC chip units.

9. The IC package according to claim 8 wherein an insulating coating is provided except for the regions of said main board external connecting printed terminal patterns and said bonding portions.

10. The IC package according to claim 1 wherein said auxiliary board further includes a plurality of through-hole patterns leading from said front-side column-direction printed wiring patterns to the back side of the auxiliary board, and back-side printed wiring patterns for connecting the back-side through-hole patterns to the unit-connecting printed terminal patterns, said front-side column-direction printed wiring patterns being connected to said unit connecting printed terminal patterns via said through-hole patterns and said back-side printed wiring patterns.

11. The IC package according to claim 10 wherein part of said front-side column-direction printed wiring patterns are connected to said unit-connecting printed terminal patterns by means of front-side printed wiring patterns.

12. The IC package according to claim 10 wherein a total of unit connecting printed terminal patterns on one auxiliary board is equal to a sum of the number of the common connecting terminals of one IC chip and the number of chip selecting terminals equivalent to the number of chips mounted on one auxiliary board.

13. The IC package according to claim 1 wherein said plural columns of printed wiring patterns running on the front side of said auxiliary board include bonding portions formed wide enough to allow bonding at the regions corresponding to said IC chip terminals.

* * * * *